(12) United States Patent
Theuss et al.

(10) Patent No.: US 10,138,115 B2
(45) Date of Patent: Nov. 27, 2018

(54) LOW PROFILE TRANSDUCER MODULE

(71) Applicant: Infineon Technologies AG, Neubiberg (DE)

(72) Inventors: Horst Theuss, Wenzenbach (DE); Alfons Dehe, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 751 days.

(21) Appl. No.: 14/452,565

(22) Filed: Aug. 6, 2014

(65) Prior Publication Data
US 2016/0043664 A1    Feb. 11, 2016

(51) Int. Cl.
*B81B 7/00* (2006.01)

(52) U.S. Cl.
CPC ...... *B81B 7/007* (2013.01); *B81B 2201/0257* (2013.01); *B81B 2207/097* (2013.01); *H01L 2224/48091* (2013.01); *H01L 2224/48137* (2013.01); *H01L 2224/49109* (2013.01)

(58) Field of Classification Search
USPC .......................................... 367/181; 257/415
See application file for complete search history.

(56) References Cited

U.S. PATENT DOCUMENTS

| 5,018,043 A | 5/1991 | Moreau |
| 5,432,758 A | 7/1995 | Sone |
| 5,740,261 A | 4/1998 | Loeppert et al. |
| 8,520,878 B2 | 8/2013 | Inoda et al. |
| 8,737,171 B2* | 5/2014 | Jenkins ................. B81B 3/0021 257/419 |
| 8,809,973 B2 | 8/2014 | Theuss |
| 8,987,844 B2* | 3/2015 | Jenkins ................. B81B 3/0021 257/416 |
| 9,239,386 B2* | 1/2016 | Elian ..................... B81B 7/0061 |
| 2005/0067688 A1* | 3/2005 | Humpston ........... B81C 1/00293 257/704 |
| 2010/0202649 A1 | 8/2010 | Inoda et al. |
| 2011/0254111 A1 | 10/2011 | Leclair et al. |
| 2012/0153771 A1* | 6/2012 | Formosa ............... B81C 1/0023 310/300 |
| 2013/0088941 A1* | 4/2013 | Elian ..................... B81B 7/0061 367/99 |
| 2013/0129136 A1 | 5/2013 | Harney et al. |
| 2013/0208438 A1 | 8/2013 | Takagi |
| 2014/0042565 A1* | 2/2014 | Fuergut ................ H04R 19/005 257/416 |

(Continued)

FOREIGN PATENT DOCUMENTS

| CN | 1038179 A | 12/1989 |
| CN | 1038179 C | 4/1998 |

(Continued)

*Primary Examiner* — James R Hulka
(74) *Attorney, Agent, or Firm* — Viering, Jentschura & Partner MBB

(57) ABSTRACT

A transducer structure is disclosed. The transducer structure may include a substrate with a MEMS structure located on a first side of the substrate and a lid coupled to the first side of the substrate and covering the MEMS structure. The substrate may include an electric contact which is laterally displaced from the lid on the first side of the substrate and electrically coupled to the MEMS structure.

19 Claims, 13 Drawing Sheets

(56) References Cited

U.S. PATENT DOCUMENTS

| | | | |
|---|---|---|---|
| 2014/0084396 A1* | 3/2014 | Jenkins | B81B 3/0021 257/419 |
| 2014/0091406 A1 | 4/2014 | Harney et al. | |
| 2014/0161290 A1* | 6/2014 | Jenkins | B81B 3/0021 381/174 |
| 2015/0003659 A1* | 1/2015 | Theuss | H04R 19/005 381/355 |
| 2015/0028436 A1* | 1/2015 | Fuergut | H04R 19/005 257/416 |

FOREIGN PATENT DOCUMENTS

| | | | | |
|---|---|---|---|---|
| CN | 1933680 A | 3/2007 | | |
| CN | 101053279 A | 10/2007 | | |
| CN | 102223593 A | 10/2011 | | |
| CN | 103241702 A | 8/2013 | | |
| CN | 203457321 U | 2/2014 | | |
| CN | 103716741 A | 4/2014 | | |
| GB | 2506174 A | * 3/2014 | ........... | B81B 3/0021 |
| GB | 2506211 A | * 3/2014 | ........... | B81B 3/0021 |
| GB | 2506979 A | * 4/2014 | ........... | B81B 3/0021 |
| JP | 2010187076 A | 8/2010 | | |
| KR | 100740462 B1 | 7/2007 | | |
| KR | 20140093684 A | 7/2014 | | |
| WO | 2007032580 A1 | 3/2007 | | |
| WO | 2007032582 A1 | 3/2007 | | |

\* cited by examiner

LOW PROFILE TRANSDUCER MODULE

TECHNICAL FIELD

Various embodiments relate to a low profile transducer module with a generally tiered or step-like shape.

BACKGROUND

Many electronic devices (e.g. smartphones, tablets, laptops, cameras, etc.) utilize a variety of electronic components, including sensors and transducers. These electronic components are generally mounted to substrates and/or circuit boards to facilitate the operation of a given electronic device. Additionally, a large number of these electronic components require special mounting techniques, such as acoustic seals, to function properly. These special mounting techniques, in combination with the thickness of the substrate, and the thickness of the component itself contribute to the overall package size. In most electronic devices, particularly consumer electronics, a smaller, thinner device is increasingly desirable.

SUMMARY

In various embodiments, a transducer structure is provided. The transducer structure may include a substrate with a micro-electro-mechanical system (MEMS) structure located on a first side of the substrate and a lid covering the MEMS structure. In various embodiments, the substrate may be implemented as an electric contact laterally displaced from the lid on the first side of the substrate and the electric contact may be electrically coupled to the MEMS structure.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosure. In the following description, various embodiments of the disclosure are described with reference to the following drawings, in which.

DESCRIPTION

The following detailed description refers to the accompanying drawings that show, by way of illustration, specific details and embodiments in which the disclosure may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface may be used herein to mean that the deposited material may be formed "directly on", e.g. in direct contact with the implied side or surface. The word "over" used with regards to a deposited material formed "over" a side or surface may be used herein to mean that the deposited material may be formed "indirectly on" the implied side or surface with one or more additional layers being arranged between the implied side or surface and the deposited material.

The term "carrier structure" as used herein should be understood to include various structures such as, e.g. a lead frame, a semiconductor substrate, such as a silicon substrate, a printed circuit board, and various flexible substrates.

In various embodiments, a diaphragm may include a plate or a membrane. A plate may be understood as being a diaphragm being under pressure. Furthermore, a membrane may be understood as being a diaphragm being under tension. Although various embodiments will be described in more detail below with reference to a membrane, it may be alternatively provided with a plate, or in general with a diaphragm.

Figure 1:
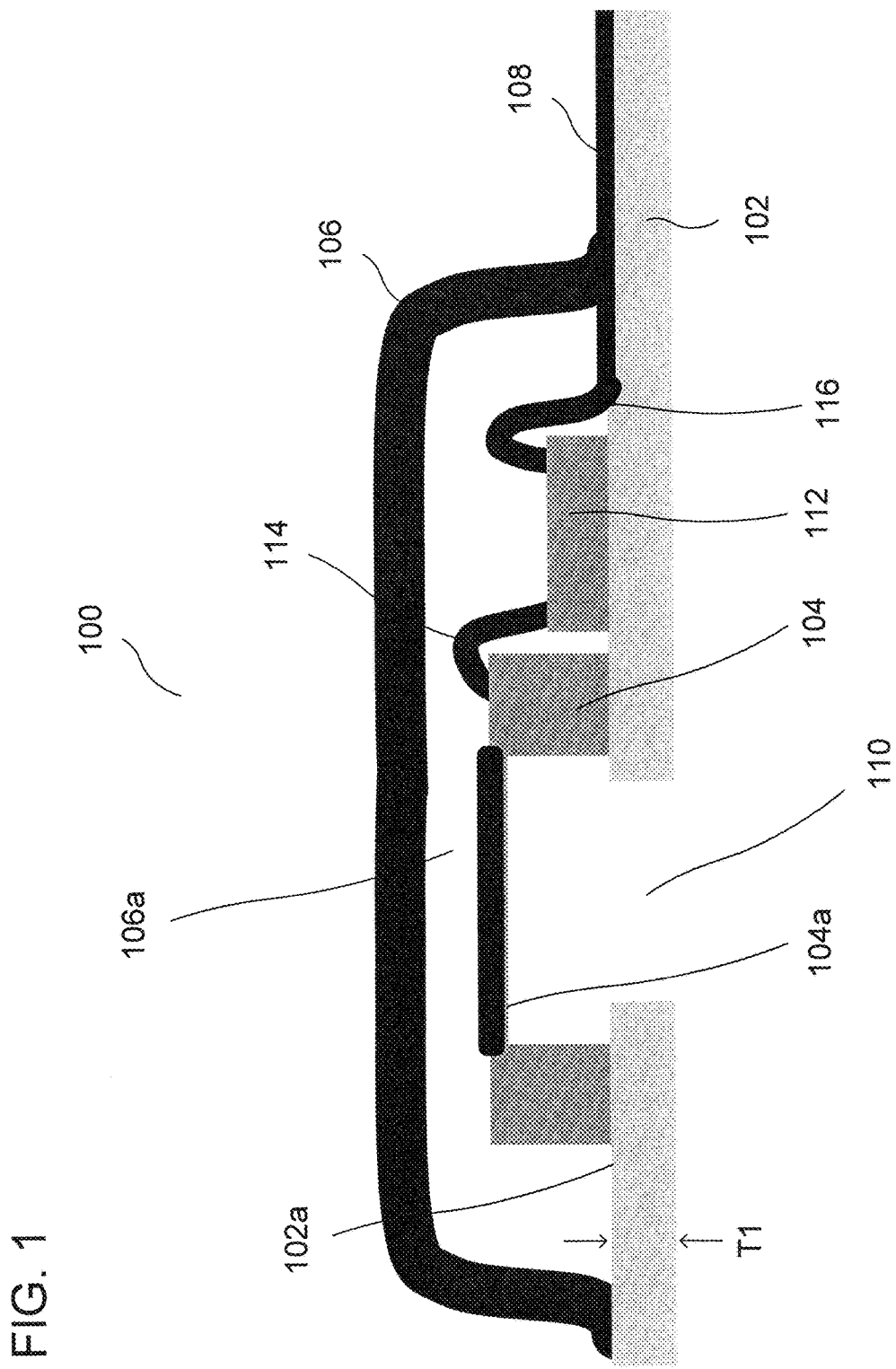
FIG. 1 shows, in accordance with a potential embodiment, a cross-sectional representation of a transducer structure including a MEMS device mounted to a substrate and suspended over an opening in the substrate and a lid coving both the MEMS device and a portion of the substrate containing the opening.

According to various embodiments, as illustrated in FIG. 1, a transducer structure 100 is disclosed. The transducer structure 100 may include a substrate 102, a MEMS structure 104 disposed over a first side 102a of the substrate 102; and a lid 106 over the first side 102a of the substrate 102 covering the MEMS structure 104. In various embodiments, the substrate 102 may include an electric contact 108 which may be laterally displaced from the lid 106 on the first side 102a of the substrate 102. In at least one embodiment, the electric contact 108 may be electrically coupled to the MEMS structure 104. In some embodiments, the transducer structure 100 may include a perforation 110 formed through the substrate 102 and arranged so that at least a portion of the MEMS structure 104 may be suspended across the perforation.

In various embodiments, the substrate 102 may include or essentially consist of a semiconductor material such as germanium, silicon germanium, silicon carbide, gallium nitride, indium, indium gallium nitride, indium gallium arsenide, indium gallium zinc oxide, or other elemental and/or compound semiconductors, e.g. a III-V compound semiconductor such as e.g. gallium arsenide or indium phosphide, or a II-VI compound semiconductor or a ternary compound semiconductor or a quaternary compound semiconductor, as may be desired for a given application. The substrate 102 may include or essentially consist of, for example, glass, and/or various polymers. The substrate 102 may be a silicon-on-insulator (SOI) structure. In some embodiments the substrate 102 may be a printed circuit board. According to various embodiments, the substrate 102 may be a flexible substrate, such as a flexible plastic substrate, e.g. a polyimide substrate. In various embodiments, the substrate 102 may include or essentially consist of one or more of the following materials: a polyester film, a thermoset plastic, a metal, a metalized plastic, a metal foil, and a polymer. In various embodiments, the substrate 102 may be a flexible laminate structure. According to various embodiments, the substrate 102 may be a semiconductor substrate, such as a silicon substrate. The substrate 102 may include or essentially consist of other materials or combinations of material, for example various dielectrics, metals, and polymers as may be desirable for a given application. In various exemplary embodiments, the substrate 102 may have a thickness T1 in the range from about 100 μm to about 700 μm, e.g. in the range from about 150 μm to about 650 μm, e.g. in the range from about 200 μm to about 600 μm, e.g. in the range from about 250 μm to about 550 μm, e.g. in the range from about 300 μm to about 500 μm, e.g. in the range from about 350 μm to about 450 μm. In some embodiments, the substrate 102 may have a thickness T1 of at least about 100 μm, e.g. of at least 150 μm, e.g. of at least 200 μm, e.g. of at least 250 μm, e.g. of at least 300 μm. In at least one embodiment, the substrate 102 may have a thickness T1 of less than or equal to about 700 μm, e.g. of less than or equal to 650 μm, e.g. of less than or equal to 600 μm, e.g. of less than or equal to 550 μm, e.g. of less than or equal to 500 μm.

In various embodiments, the MEMS structure 104 may be implemented as a MEMS microphone, a MEMS speaker, or a MEMS pressure sensor. In various embodiments, the MEMS structure 104 may be arranged on the first side 102a of the substrate 102 so that at least a portion of the MEMS structure 104 may be suspended across the perforation 110. The portion of the MEMS structure 104 which may be suspended across the perforation 110, in some embodiments, may be a membrane structure 104a. According to various embodiments, the MEMS structure 104 may be secured and/or mounted to the first surface 102a of the substrate 102 through various means, e.g. adhesives, sealants, and epoxies as may be desirable for a given application, for example a conductive or nonconductive epoxy, a silicone based glue, a polymer adhesive such as SU-8 or benzocyclobutene (BCB), and various adhesive foils. In some embodiments, the MEMS structure 104 may be electrically connected to the substrate 102. In at least one embodiment the MEMS structure 104 may electrically isolated and/or insulated from the substrate 102 as may be necessitated by a given application.

In various embodiments, the membrane structure 104a may be square or substantially square shaped. The membrane structure 104a may be rectangular or substantially rectangular in shape. According to various embodiments, the membrane structure 104a may be a circle or substantially circular in shape. According to various embodiments, the membrane structure 104a may be an oval or substantially oval in shape. The membrane structure 104a may be a triangle or substantially triangular in shape. The membrane structure 104a may be a cross or substantially cross-shaped. In some embodiments, membrane structure 104a may be formed into any shape that may be desired for a given application. The membrane structure 104a may be composed of or may include a semiconductor material such as, e.g. silicon. In various embodiments, the membrane structure 104a may include or may be composed of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as desired for a given application.

According to various embodiments, the lid 106 may be arranged on and/or secured to the first side 102a of the substrate 102. In various embodiments, the lid 106 and the substrate 102 may be arranged in a substantially tiered and/or step-like shape. That is to say that the lid 106 may be secured to the first side 102a of the substrate 102 and a portion of the substrate 102 may extend beyond the perimeter of the lid 106 such that a stepped structure is formed. The lid 106 may be secured and/or attached to the first side 102a of the substrate 102 by using various means, such as, but not limited to, adhesives, sealants, and epoxies as may be desirable for a given application, for example a conductive or nonconductive epoxy, a silicone based glue, a polymer adhesive, and various adhesive foils. According to various embodiments, the lid 106 and the substrate 102 may be arranged to enclose a volume 106a. In some embodiments, the lid 106 may be electrically connected to the substrate 102. In at least one embodiment the lid 106 may electrically isolated and/or insulated from the substrate 102 as may be required for a given application. The lid 106 may be capable of providing electromagnetic shielding for the MEMS structure 104. In some embodiments the lid 106 may be composed of and/or may include various elemental metals, e.g. copper, nickel, tin, lead, silver, gold, aluminum, and various metal alloys such as e.g. cupronickel, nickel-aluminum, etc. The lid 106 may include or be composed of other assorted materials, e.g. a metallic material, a metal foil, a solder wettable material, various metal alloys and/or compound metals, and various elemental metals as may be desirable for a given application. According to various embodiments, the lid 106 may be implemented as various molded lead frame chip packaging formats, e.g. a micro lead frame package (MLP), a small-outline no-leads package (SON), a quad-flat no-leads package (QFN), a dual-flat no-leads package (DFN), various air-cavity and/or plastic-molded QFN packages, and other lead frame configurations as may be desirable for a given application.

According to various embodiments, the electric contact 108 may be formed on the first side 102a of the substrate 102. In some embodiments, the electric contact 108 may extend from a portion the first side 102a of the substrate 102 which may be outside and/or not contained under the lid 106 to a portion of the first side 102a of the substrate 102 which is inside and/or under the lid 106. In other words, the electric contact 108 may extend along the surface of the first side 102a of the substrate 102 from a location inside the volume 106a to a location outside the volume 106a. In some embodiments, the lid 106 may be mechanically (in other words physically) attached to the electrical contact 108. According to an embodiment, the electrical contact 108 may be electrically connected to the lid 106, while in other embodiments the electrical contact 108 may be electrically insulated from the lid 106. The electric contact 108 may be formed through various patterning and/or deposition techniques, such as through an electrolytic plating process or a photolithography process. According to various embodiments, the electrical contact 108 may be formed of a conductive material such as a metallic material, a metalized material, a metal foil, an elemental metal, and a metal alloy. For example, the electric contact 108 may be composed of or may include copper, nickel, tin, lead, silver, gold, aluminum, and various alloys of these metals such as e.g. cupronickel, nickel-aluminum, etc. Further, the electric contact 108 may include or may be composed of other materials as may be desirable for a given application.

In some embodiments, the perforation 110 may be implemented as an acoustic communication port for conducting acoustic waves to the MEMS structure 104. The perforation 110 may formed through the substrate 102 by various techniques, e.g. laser drilling, various grinding techniques, deep reactive-ion etching, isotropic gas phase etching, vapor etching, wet etching, isotropic dry etching, plasma etching, etc. In various embodiments, the perforation 110 may be square or substantially square in shape. The perforation 110 may be rectangular or substantially rectangular in shape. According to various embodiments, the perforation 110 may be a circle or substantially circular in shape. The perforation 110 may be an oval or substantially oval-like in shape. According to various embodiments, the perforation 110 may be a triangle or substantially triangular in shape. The perforation 110 may be a cross or substantially cross shaped. According to various embodiments, the perforation 110 may be formed into any shape that may be desired for a given application.

In various embodiments, the transducer structure 100 may include an integrated circuit 112. The integrated circuit 112 may be implemented as an application specific integrated circuit (ASIC), e.g. various types of ASICs such as a gate-array ASIC, a standard-cell ASIC, a full-custom ASIC, a structured design ASIC, a cell-library ASIC, and various intellectual property (IP) core ASICs. According to an embodiment, the integrated circuit 112 may be implemented as any type of circuit as may be desirable for a given application. According to various embodiments, the integrated circuit 112 may be electrically coupled and/or connected to the MEMS structure 104. The integrated circuit 112 may be electrically connected to the MEMS structure 104 via wire-bond element 114 and to the electric contact 108 via wire-bond element 116. In some embodiments, the integrated circuit 112 may be configured to process at least one electrical signal generated by the MEMS structure 104. For example, where the MEMS structure 104 may be implemented as a MEMS microphone, the integrated circuit 112 may be configured to measure a change in a capacitance generated in the MEMS structure 104, e.g. by a sound wave incident on the MEMS structure 104, and to convert said signal into usable information regarding the magnitude of the sound wave. In other embodiments, the MEMS structure 104 may be implemented as a MEMS pressure sensor and the integrated circuit 112 may be configured to measure and process an electrical signal generated by the MEMS pressure sensor regarding a change in ambient pressure. In another embodiment, MEMS structure 104 may be implemented as a MEMS speaker and the integrated circuit 112 may be configured to process and transmit an electrical signal to the MEMS speaker, where said signal may cause the MEMS speaker to generate sound waves at various magnitudes and frequencies as may be desirable for a given application. In at least one embodiment, the integrated circuit 112 may be configured to process and/or transmit any type of signal as may be desirable for a given application.

Figure 2:
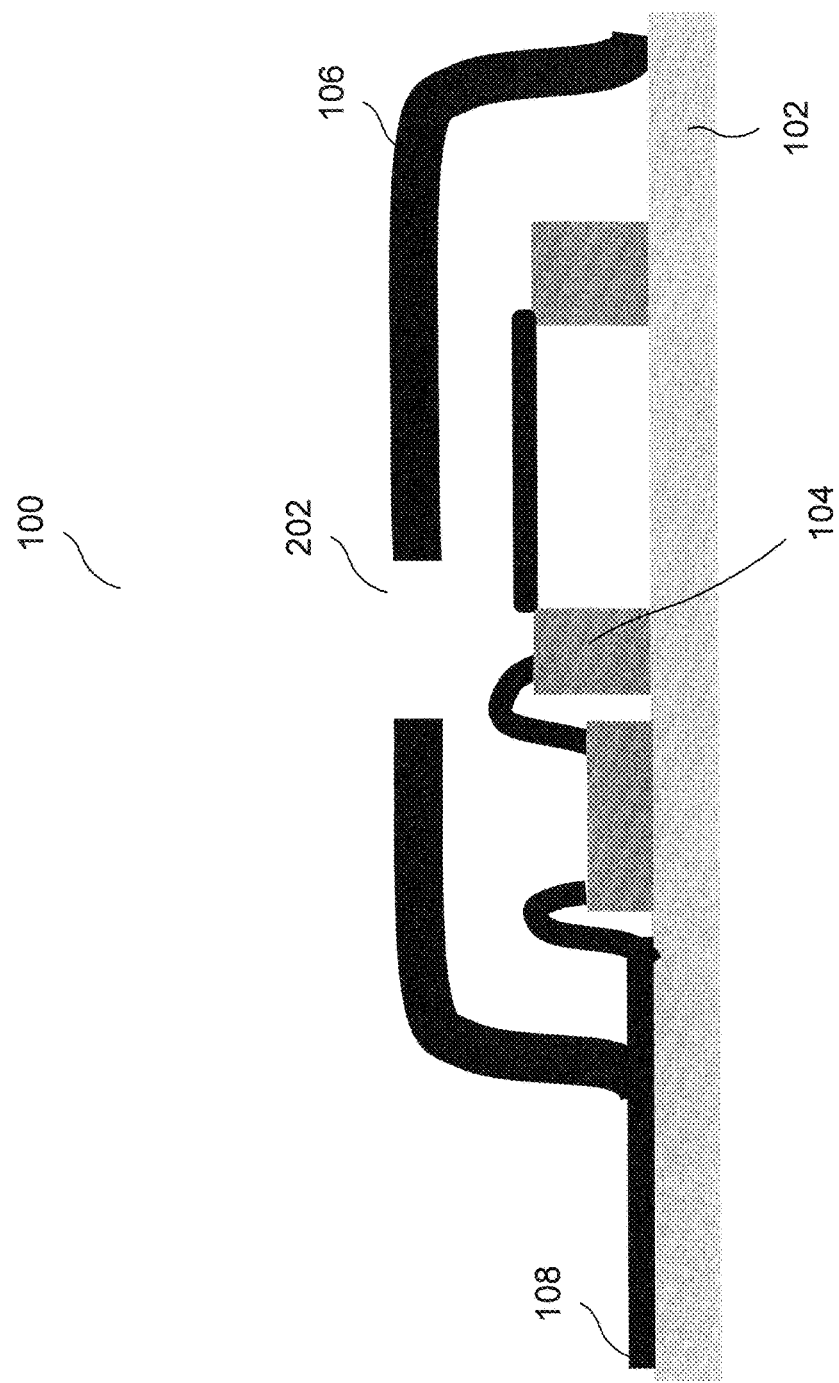
FIG. 2 shows, according to an embodiment, a cross-sectional representation of a transducer structure including a MEMS device mounted to a substrate, a lid covering the MEMS device, and an opening in the lid arranged above the MEMS device.

According to various embodiments, as illustrated in FIG. 2, the transducer structure 100 may include a void (which may also be referred to as an opening) 202 formed in the lid 106. In various embodiments, the void 202 may be implemented as an acoustic communication port for conducting acoustic waves to the MEMS structure 104. The void 202 may formed through the lid 106 using various techniques, e.g. laser drilling, various grinding techniques, deep reactive-ion etching, isotropic gas phase etching, vapor etching, wet etching, isotropic dry etching, plasma etching, etc. In various embodiments, the void 202 may be square or substantially square in shape. The void 202 may be rectangular or substantially rectangular in shape. According to various embodiments, the void 202 may be a circle or substantially circular in shape. The void 202 may be an oval or substantially oval-like in shape. According to various embodiments, the void 202 may be a triangle or substantially triangular in shape. The void 202 may be a cross or substantially cross shaped. According to various embodiments, the void 202 may be formed into any shape that may be desired for a given application.

Figure 3:
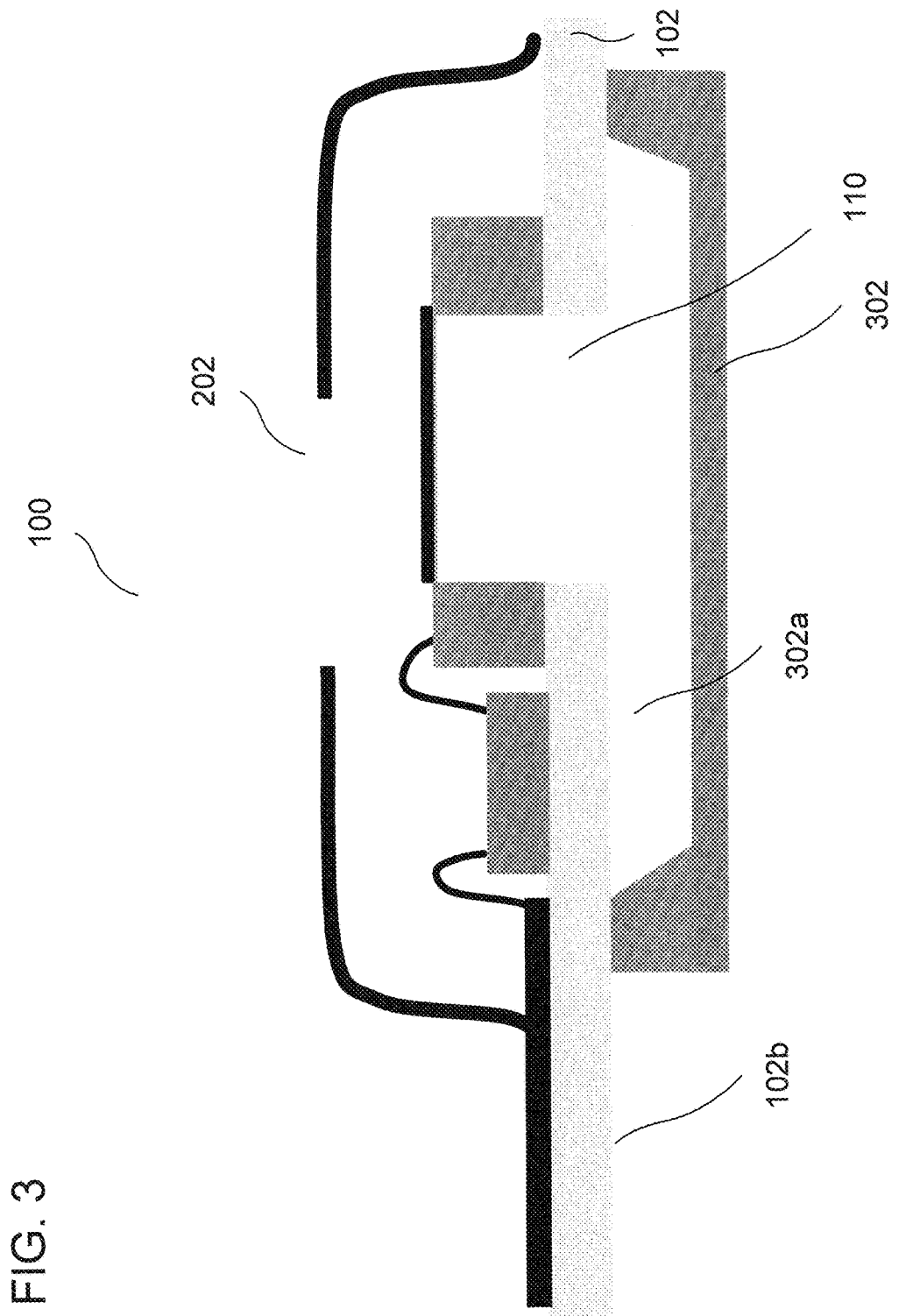
FIG. 3 shows a cross-sectional representation of an exemplary embodiment of a transducer structure including a MEMS device mounted to a substrate and suspended over an opening in the substrate, a lid covering the MEMS device, an opening in the lid arranged above the MEMS device, and a back volume lid coupled to the substrate on a side opposite the lid.

According to various embodiments, as illustrated in FIG. 3, the transducer structure 100 may include a back volume lid 302 arranged over a second side 102b of the substrate 102. The second side 102b of the substrate 102 may be the side opposite the first side 102a of the substrate 102. The back volume lid 302 may be mechanically attached to the second side 102b of the substrate 102 so that a volume 302a is contained and/or enclosed by the second side 102b of the substrate 102 and the back volume lid 302. In various embodiments the volume 302a may be implemented to increase the so-called back volume necessary for the operation of various MEMS devices, e.g. a MEMS microphone. In various embodiments, the back volume lid 302 may be structured such that the volume 302a is substantially cubic and/or cube shaped. The back volume lid 302 may be structured so that the volume 302a may have a substantially rectangular cuboid shape. In various embodiments, the volume 302a may be at least partially spherical in shape, e.g. the back volume lid 302 may have a domed or dome-like structure. The volume 302a may be substantially pyramidal and/or pyramid-like in shape. According to various embodiments, the volume 302a may be formed into any shape that may be desired for a given application. In various embodiments, the back volume lid 302 may include or may be composed of, for example, a thermoset plastic, an epoxy plastic, a metal, a metalized plastic, a metal foil, and various polymers as may be desirable for a given application.

Figure 4:
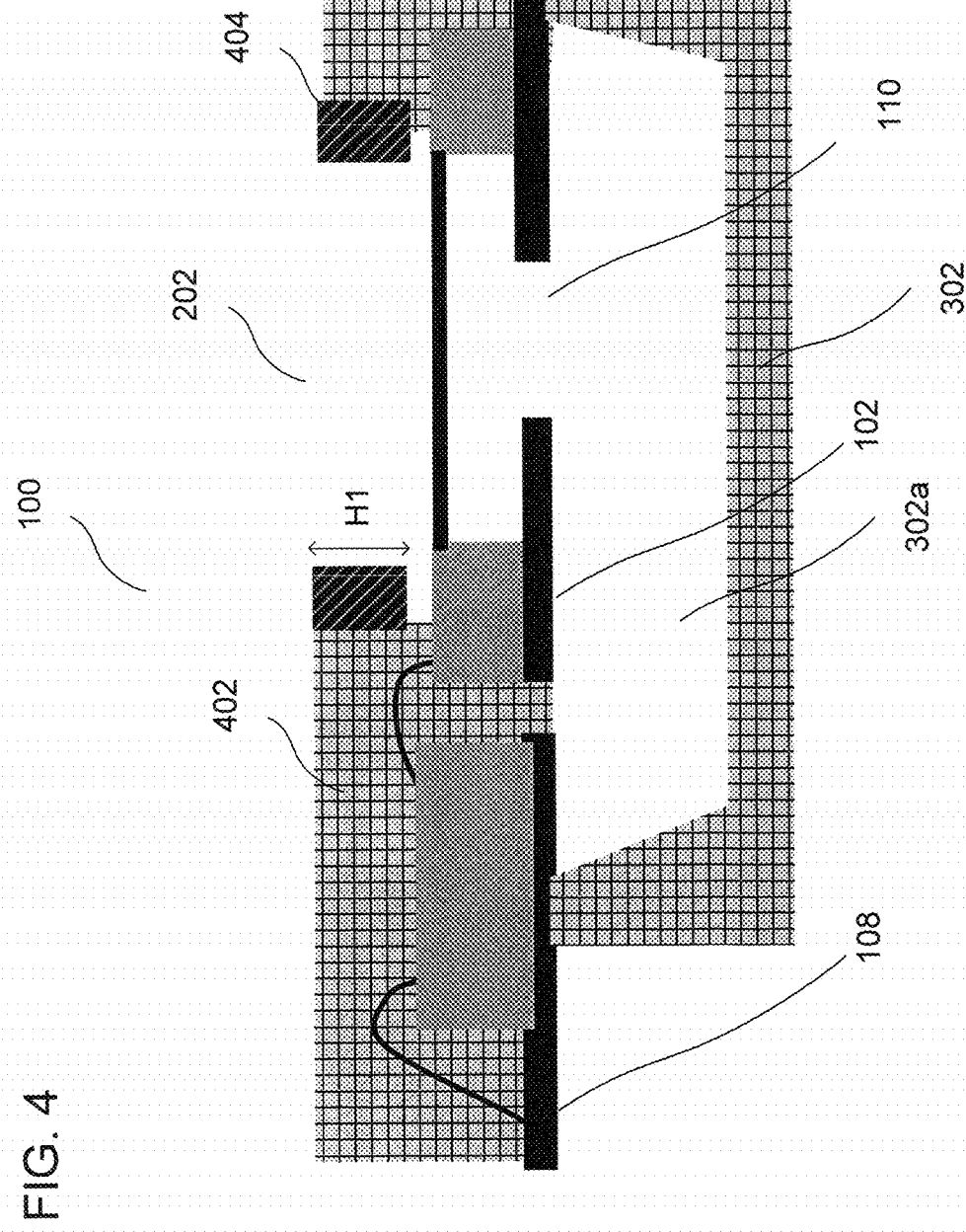
FIG. 4 shows, in cross-sectional form, a potential embodiment where the transducer structure is implemented as molded lead frame chip package.

According to various embodiments, as illustrated in FIG. 4, the transducer structure 100 may include an encapsulation layer 402. The encapsulation layer 402 may be formed and/or deposited through various processes, e.g. transfer molding, compression molding, injection molding, plunger molding, a film-assisted molding, a glob top process, and various sintering processes such as hot compression molding and isostatic pressing. According to various embodiments, the encapsulation layer 402 may include or essentially consist of a molding material such as various thermosetting polymers, thermosetting plastics, thermosetting resins, a polyester resin, a film, a polyamide, and various epoxies or epoxy resins. In some embodiments, the encapsulation layer 402 may include or essentially consist of any material that may be desirable for a given application. In various embodiments, the transducer structure 100 may be implemented as various molded chip packaging formats, e.g. a micro lead frame package (MLP), a small-outline no leads package (SON), a quad-flat no-leads package (QFN), a dual-flat no-leads package (DFN), various air-cavity and/or plastic-molded QFN packages, and other lead frame configurations as may be desirable for a given application. In various embodiments where the transducer structure 100 may be implemented as molded chip package, the substrate 102 may be implemented as a metal lead frame, e.g. a lead frame which may include or essentially consist of various elemental metals, such as copper, nickel, tin, lead, silver, gold, aluminum, and various metal alloys e.g. cupronickel, nickel-aluminum, etc. Further, the lead frame may include or essentially consist of various other materials, e.g. a metallic material, a metal foil, a solder wettable material, various metal alloys and/or compound metals, and various elemental metals as may be desirable for a given application.

According to various embodiments, as illustrated in FIG. 4, the transducer structure 100 may include at least one spacer structure 404. The spacer structure 404 may be arranged at an edge region of the void 202. According to various embodiment, the spacer structure 404 may include or essentially consist of a semiconductor material such as silicon, germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as may be desired for a given application. In various embodiments, the spacer structure 404 may include or essentially consist of various photopolymers, photo-resins, thermoplastics, and photoresists, e.g. various acrylates, methacrylates, photoinitiators, epoxide resins, negative photoresists, and positive photoresists. In various embodiments, the spacer structure 404 may have a height, H1, in the range from about 5 µm to about 500 µm, e.g. in the range from about 5 µm to about 10 µm, e.g. in the range from about 10 µm to about 20 µm, e.g. in the range from about 20 µm to about 30 µm, e.g. in the range from about 30 µm to about 50 µm, e.g. in the range from about 50 µm to about 100 µm, e.g. in the range from about 100 µm to about 200 µm, e.g. in the range from about 200 µm to about 300 µm, e.g. in the range from about 300 µm to about 500 µm. According to various embodiments, the spacer structure 404 may be deposited through various techniques, e.g. vapor deposition, electrochemical deposition, chemical vapor deposition, molecular beam epitaxy, spin coating, and various other techniques as may be desirable for a given application. In various embodiments, the spacer structure 404 may be configured to prevent the encapsulation layer 402 from being deposited in the void 202. The spacer structure 404 may be part of a frame or frame-like structure arranged at an edge region of the void 202. In various embodiments, said frame or frame-like structure may be configured to assist in a type of transfer molding process, such as a film-assisted molding process.

Figure 5:
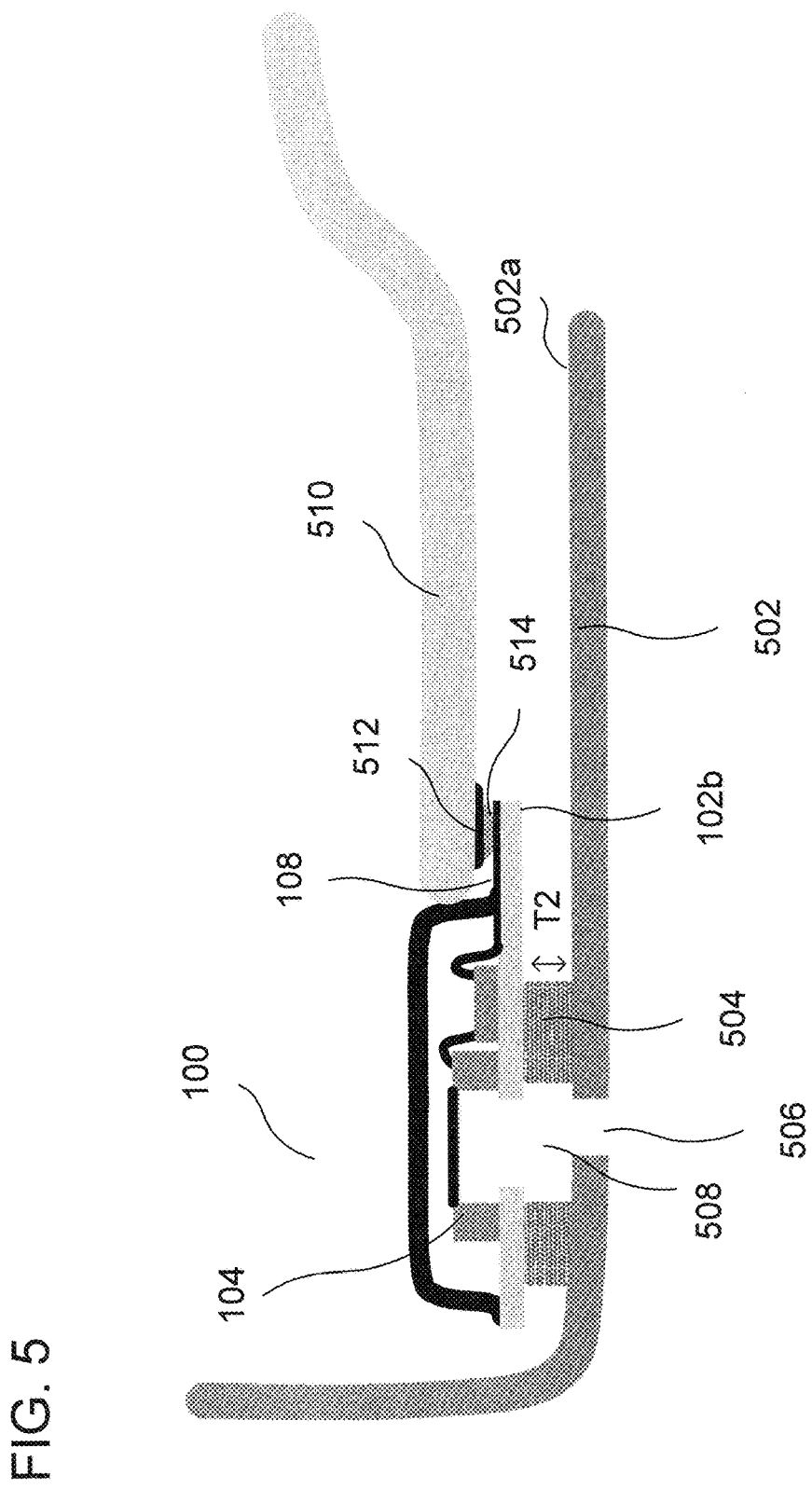
FIG. 5 shows a cross-sectional representation of a potential embodiment where a transducer structure is coupled to a further housing structure and to a further substrate.

According to various embodiments, as illustrated in FIG. 5, the transducer structure 100 may be implemented in various portable electronic devices, e.g. cellular telephones, portable Global Positioning System (GPS) devices, various electronic image capture devices, etc. In some embodiments, where the transducer structure 100 may be implemented in a portable electronic device, the transducer structure 100 may be mounted and/or secured to a surface of the device housing 502. The transducer structure 100 may be secured to the device housing 502 by a mounting structure 504. In some embodiments, the mounting structure 504 may be implemented as a plurality of mounting structures. The mounting structure 504 may mechanically fix the transducer structure 100 to the device housing 502. The mounting structure 504 may be arranged between the second side 102b of the substrate 102 and an inner surface 502a of the device housing 502. In various embodiments, the transducer structure 100 may be arranged over and/or may partially span an opening 506 in the device housing 502. In various embodiments, the opening 506 in the device housing 502 may be implemented as an acoustic communication port for conducting acoustic energy to the MEMS structure 104. In some embodiments, the mounting structure 504 may be arranged at and/or near the perimeter of the opening 506 and implemented as an acoustical seal to assist in channeling acoustic energy toward the MEMS structure 104. In some embodiments, the mounting structure 504 may have a thickness T2 in the range from about 50 µm to about 500 µm, e.g. in the range from about 50 µm to about 100 µm, e.g. in the range from about 100 µm to about 150 µm, e.g. in the range from about 150 µm to about 200 µm, e.g. in the range from about 250 µm to about 300 µm, e.g. in the range from about 300 µm to about 350 µm. In some embodiments, the mounting structure 504 may have a thickness T2 of at least about 100 µm, e.g. of at least 150 µm, e.g. of at least 200 µm, e.g. of at least 250 µm, e.g. of at least 300 µm. In at least one embodiment, the mounting structure 504 may have a thickness T2 of less than or equal to about 700 µm, e.g. of less than or equal to 650 µm, e.g. of less than or equal to 600 µm, e.g. of less than or equal to 550 µm, e.g. of less than or equal to 500 µm.

In some embodiments where the transducer structure 100 may be implemented in various portable electronic devices, as illustrated in FIG. 5, the electrical contact 108 may be used to electrically and/or mechanically connect the transducer structure 100 to other components within the various portable electronic devices. In the embodiment depicted in FIG. 5, the transducer structure 100 is coupled to a device contact pad 512 which is located on a device substrate 510. The device contact pad 512 is electrically and/or mechanically coupled to the electrical contact 108 via the coupling structure 514. In some embodiments, the coupling structure 514 may be implemented as various electrical and/or mechanical coupling means, e.g. solder, various electrically conductive pastes and epoxies, etc. According to various embodiments, the device substrate 510 may be a flexible substrate, such as a flexible plastic substrate, e.g. a polyimide substrate. In various embodiments, the device substrate 510 may be composed of or may include one or more of the following materials: a polyester film, a thermoset plastic, a metal, a metalized plastic, a metal foil, and a polymer. In various embodiments, the device substrate 510 may be a flexible laminate structure. According to various embodiments, the device substrate 510 may be a semiconductor substrate, such as a silicon substrate. The device substrate 510 may include or essentially consist of other semiconductor materials such as germanium, silicon germanium, silicon carbide, gallium nitride, indium, indium gallium nitride, indium gallium arsenide, indium gallium zinc oxide, or other elemental and/or compound semiconductors (e.g. a III-V compound semiconductor such as e.g. gallium arsenide or indium phosphide, or a II-VI compound semiconductor or a ternary compound semiconductor or a quaternary compound semiconductor) as may be desired for a given application. The device substrate 510 may include or essentially consist of other materials or combinations of material, for example various dielectrics, metals, and polymers as may be desirable for a given application. The device substrate 510 may include, for example, glass, and/or various polymers. The device substrate 510 may be a silicon-on-insulator (SOI) structure. The device substrate 510 may be a printed circuit board.

Figure 6:
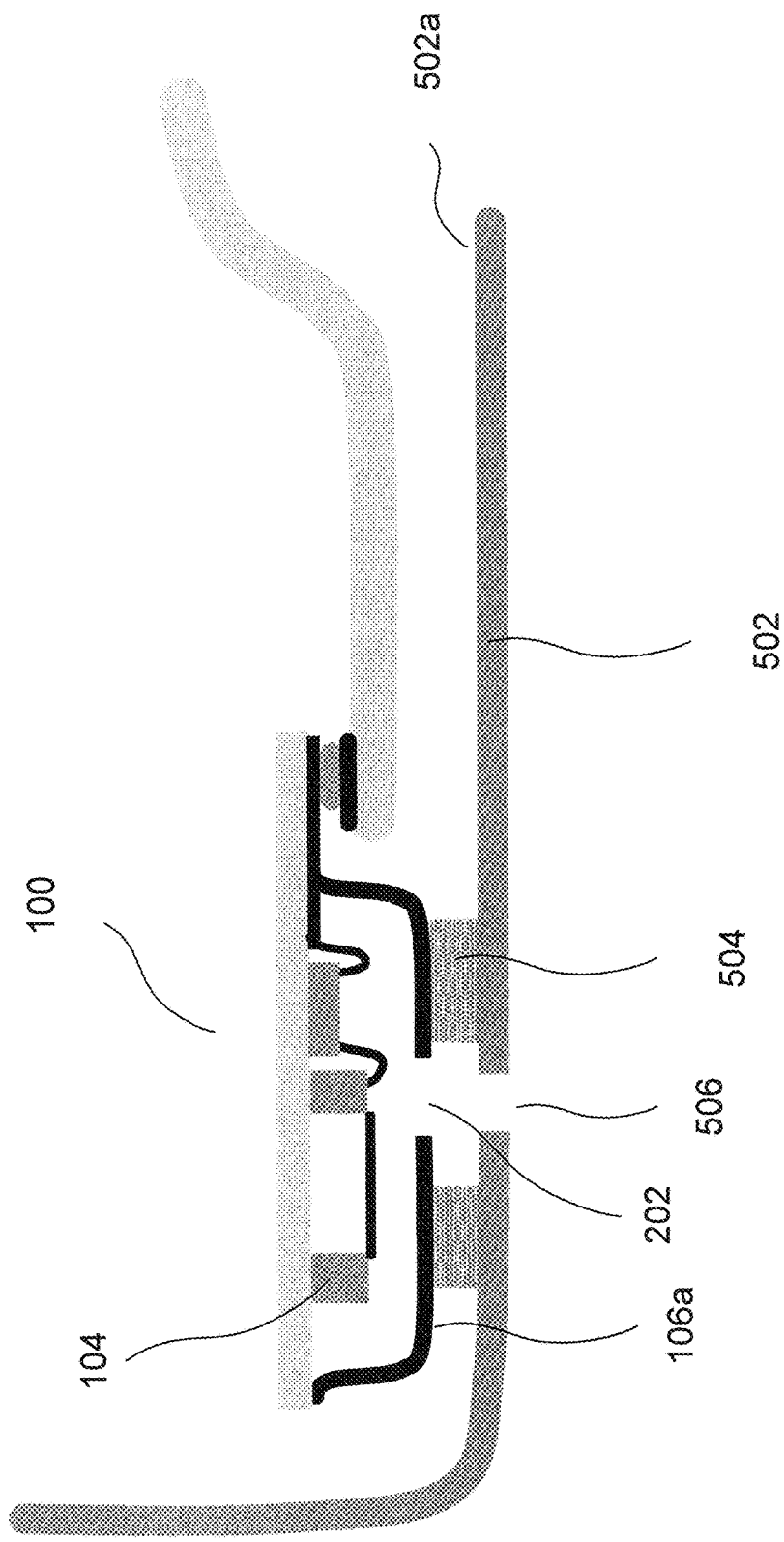
FIG. 6 shows a cross-sectional representation of a potential embodiment similar to the embodiment in FIG. 5, but with a transducer structure which is in a different orientation relative to the further housing structure.

In embodiments where the transducer structure 100 may be implemented in various portable electronic devices, as illustrated in FIG. 6, the transducer structure 100 may be oriented relative to the device housing 502 so that the mounting structure 504 may be arranged between an outer surface 106a of the lid 106 and an inner surface 502a of the device housing 502. In various embodiments, the opening 506 in the device housing 502 may be implemented as an acoustic communication port for conducting acoustic energy to the void 202 and the void 202 may be implemented as an acoustic communication port for conducting acoustical energy to the MEMS structure 104. In some embodiments, the opening 506 in the device housing 502 may optionally be excluded and/or be located in a portion of the device housing 502 remotely located from the transducer structure 100 (not shown).

Figure 7:
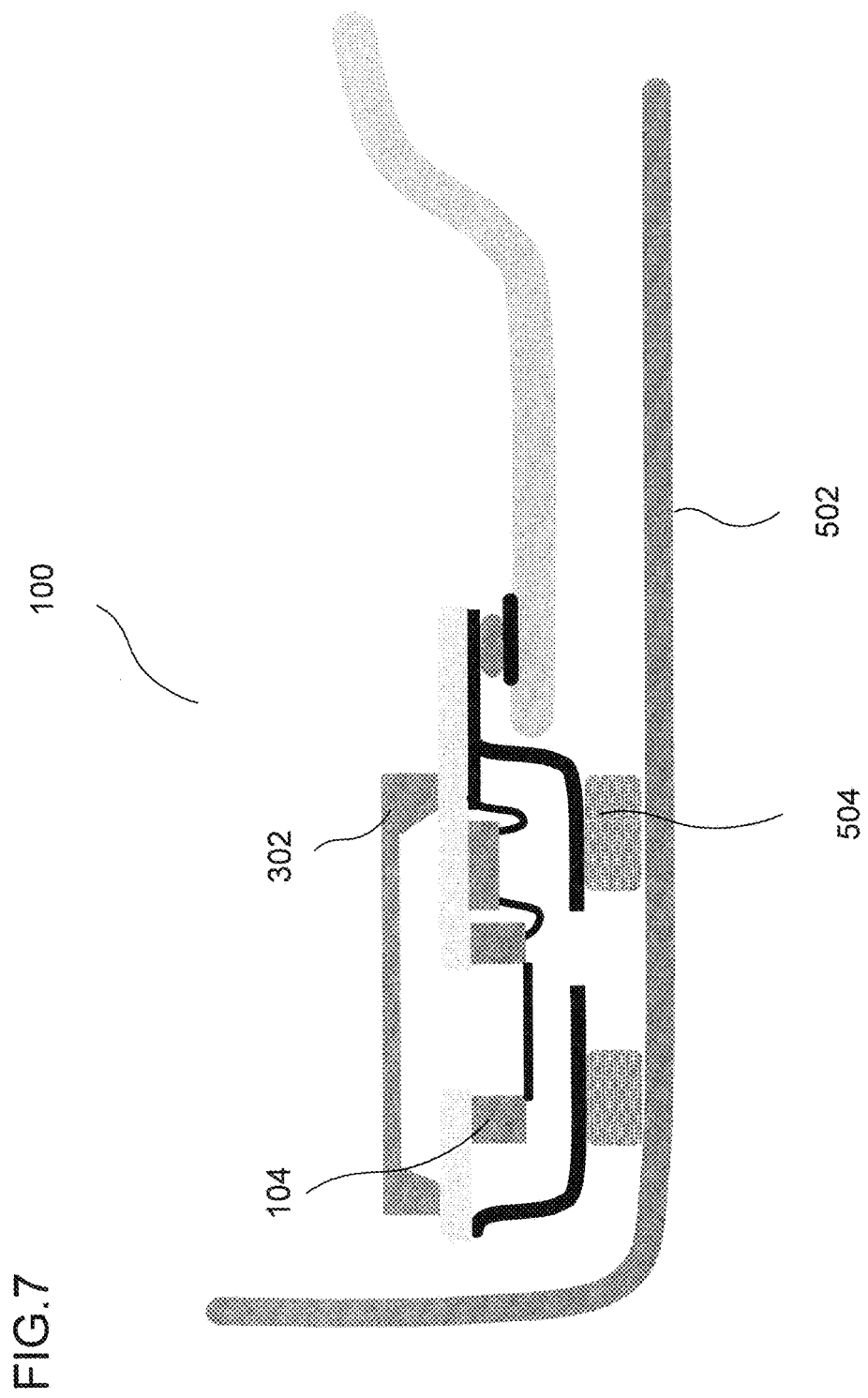
FIG. 7 shows a cross-sectional representation of a potential embodiment similar to the embodiment in FIG. 6, but with the addition of a back volume lid.

In embodiments where the transducer structure 100 may be implemented in various portable electronic devices, as illustrated in FIG. 7, the transducer structure 100 may optionally include the back volume lid 302.

Figure 8:
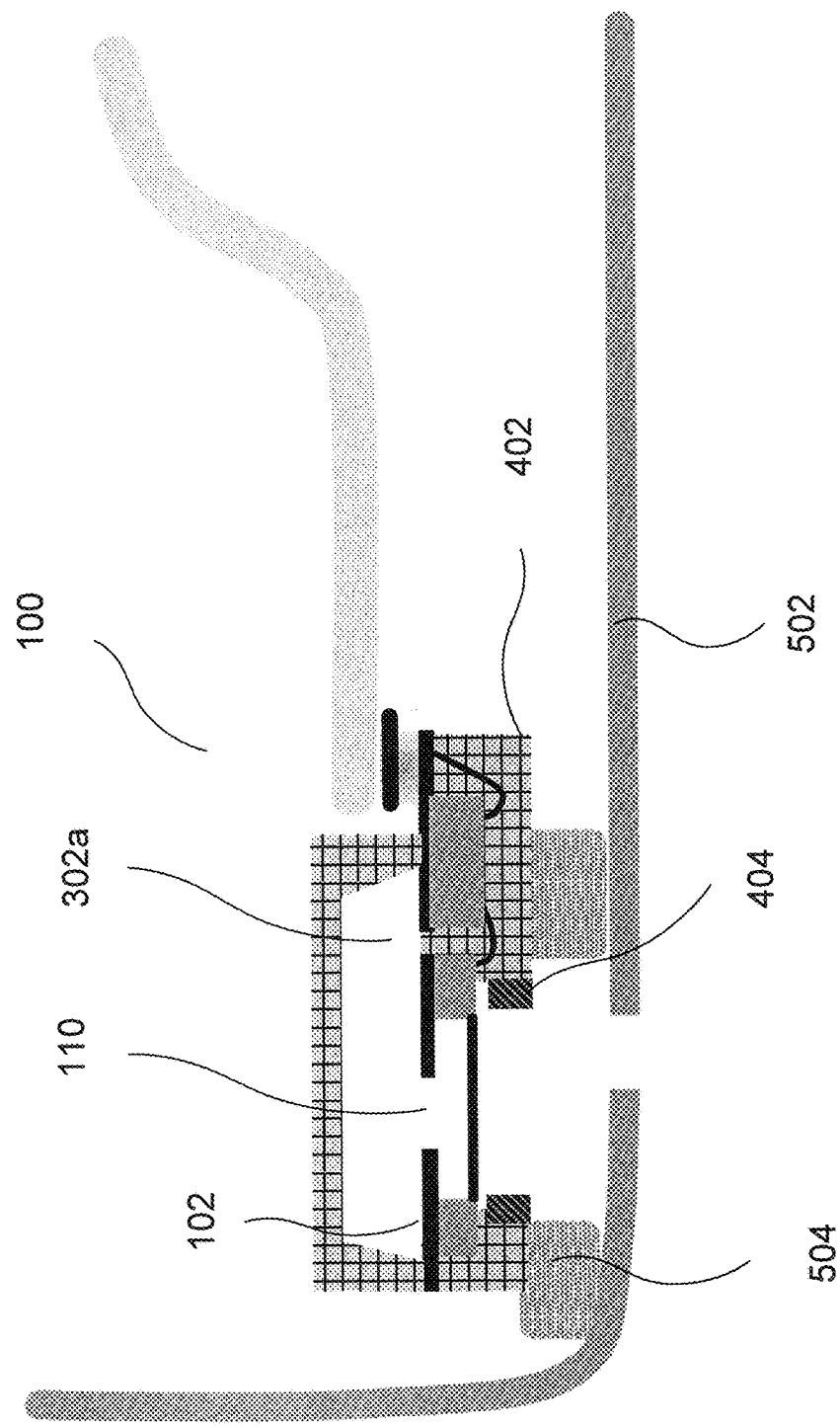
FIG. 8 shows, in cross-sectional form, a potential embodiment similar to those shown in FIGS. 5-7, where the transducer structure is implemented as molded lead frame chip package.
Figure 9:
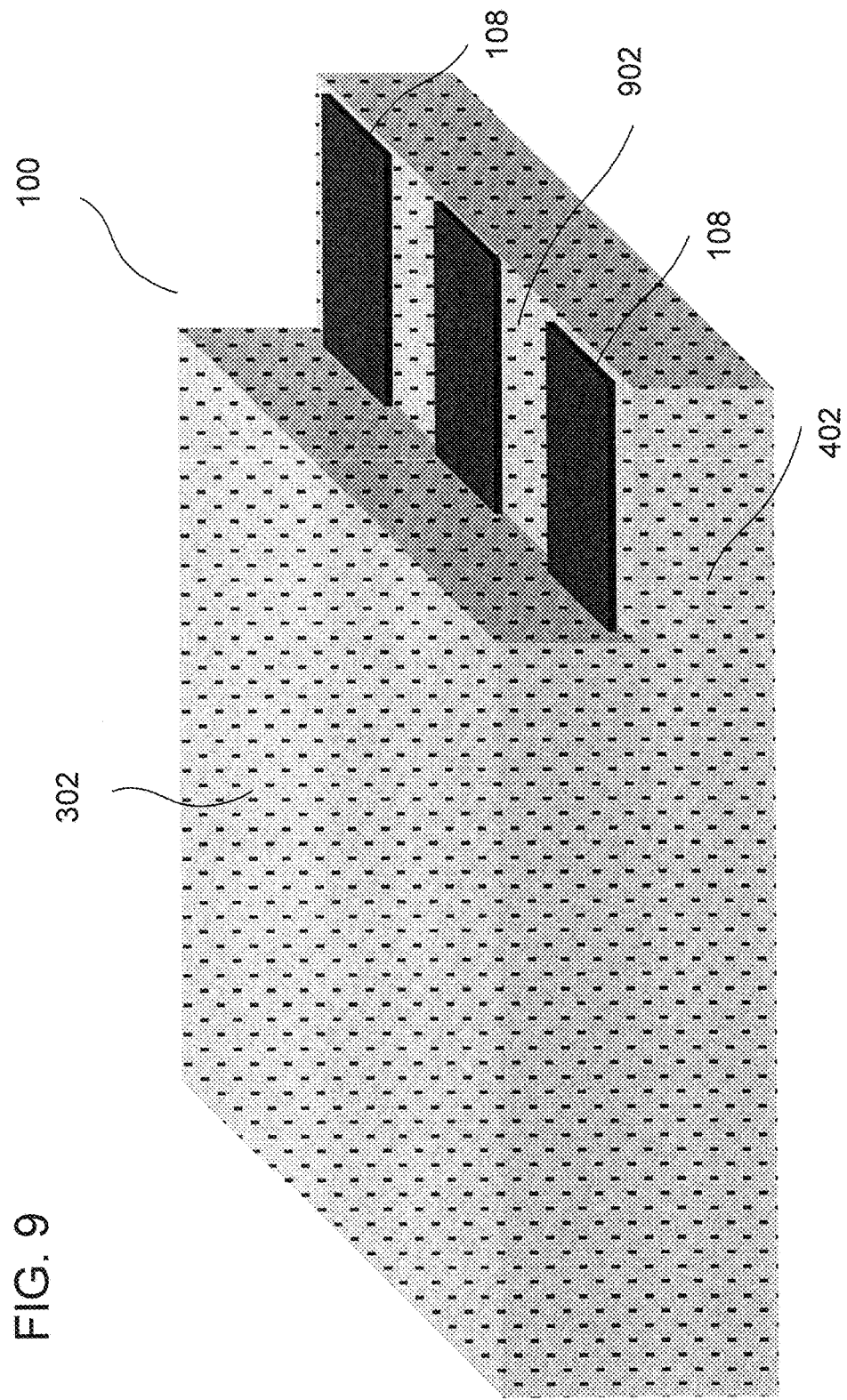
FIG. 9 shows a potential embodiment of a transducer structure implemented as molded lead frame chip package.

In various embodiments where the transducer structure 100 may be implemented in portable electronic devices, as illustrated in FIG. 8, the transducer structure 100 may be implemented as molded chip package, the substrate 102 may be implemented as a metal lead frame, e.g. a lead frame, similar to the structure depicted in FIG. 4 and described in detail above. In an embodiment, as illustrated in FIG. 9, where the transducer structure 100 may be implemented as a molded chip package, the back volume lid 302 may be composed of and/or may include a molding material such as various thermosetting polymers, thermosetting plastics, thermosetting resins, a polyester resin, a film, a polyamide, and various epoxies or epoxy resins. According to various embodiments, the back volume lid 302 and the encapsulation layer 402 may be integrally formed and in some embodiments, may be implemented as a single structure composed of a molding material, such as the materials listed above. In some embodiments, the back volume lid 302 and the encapsulation layer 402 may define the outer surface of the sensor structure 100. In the embodiments depicted in FIG. 9, the back volume lid 302 and the encapsulation layer 402 define the outer surface of the sensor structure 100 and are formed into a step-like, multi-tiered structure. Likewise in the embodiment depicted in FIG. 9, the electrical contact 108 is implemented as a plurality of electrical contact pads located on the step-like structure of the sensor structure 100. In other words, if the sensor structure 100 is analogized to a staircase, the electrical contact 108 may be located on the "tread" portion of the hypothetical staircase.

Figure 10:
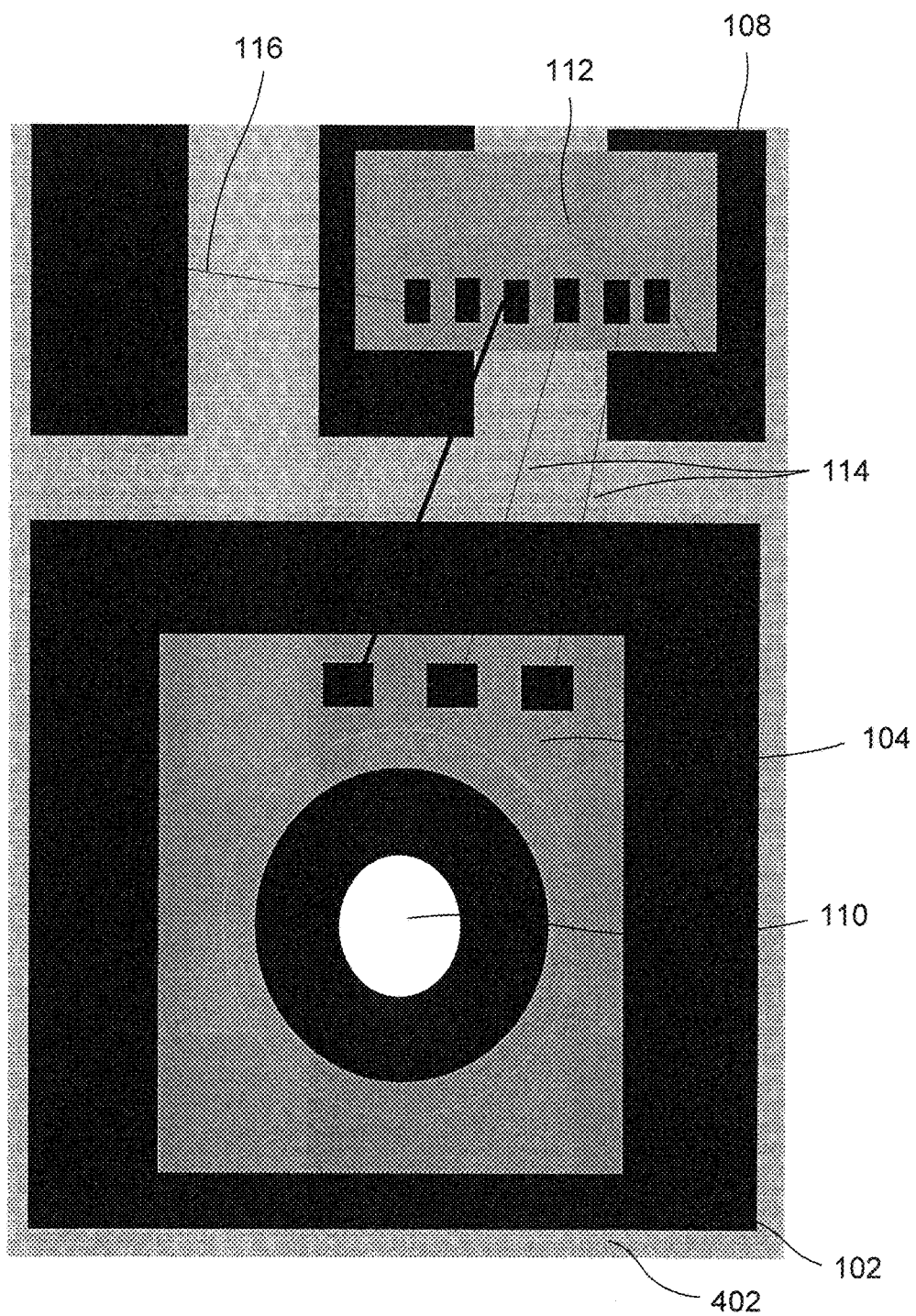
FIG. 10 shows a top-down, overhead view of the transducer structure depicted in FIG. 9, where portions of the molded lead frame chip package have been rendered transparent to better display potential features of the disclosure.

In various embodiments, as illustrated in FIG. 10, the encapsulation layer 402 and the back volume lid 302 may completely enclose and/or encapsulate the substrate 102, the MEMS structure 104, the integrated circuit 112, wire-bond elements 114, and wire bond-elements 116. In some embodiments, the integrated circuit 112 may be located in a portion of the encapsulation layer 402 which may be below and/or underneath the electrical contact 108. In various embodiments, the encapsulation layer 402 and/or the back volume lid 302 (not shown in FIG. 10) may immobilize and/or secure wire bond elements 114 and 116, respectively.

Figure 11:
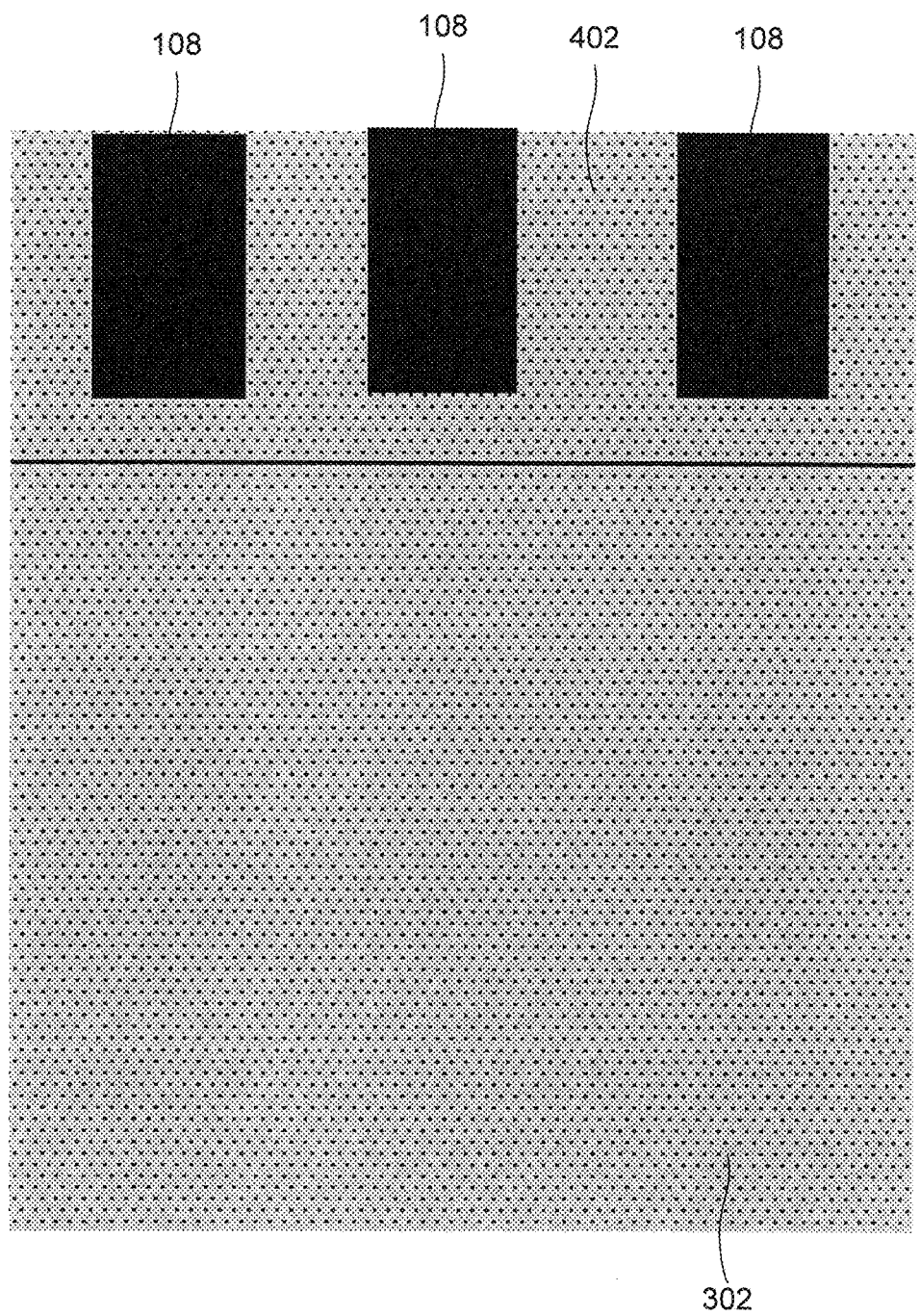
FIG. 11 shows a top-down, overhead view of the transducer structure depicted in FIG. 10 where the transparent portions omitted from FIG. 10 have been replaced.

In various embodiments, as depicted in FIG. 11, the exterior surface of the sensor structure 100 may include or essentially consist of the encapsulation layer 402 and/or the back volume lid 302. In some embodiments, when viewed from a top-down perspective, the only visible external feature of the sensor structure 100, apart from the encapsulation layer 402 and/or the back volume lid 302, may be the electrical contact 108. In other words, the electrical contact 108 may be arranged on a side of the sensor structure 100 which may generally be considered the top side of the sensor structure 100.

Figure 12:
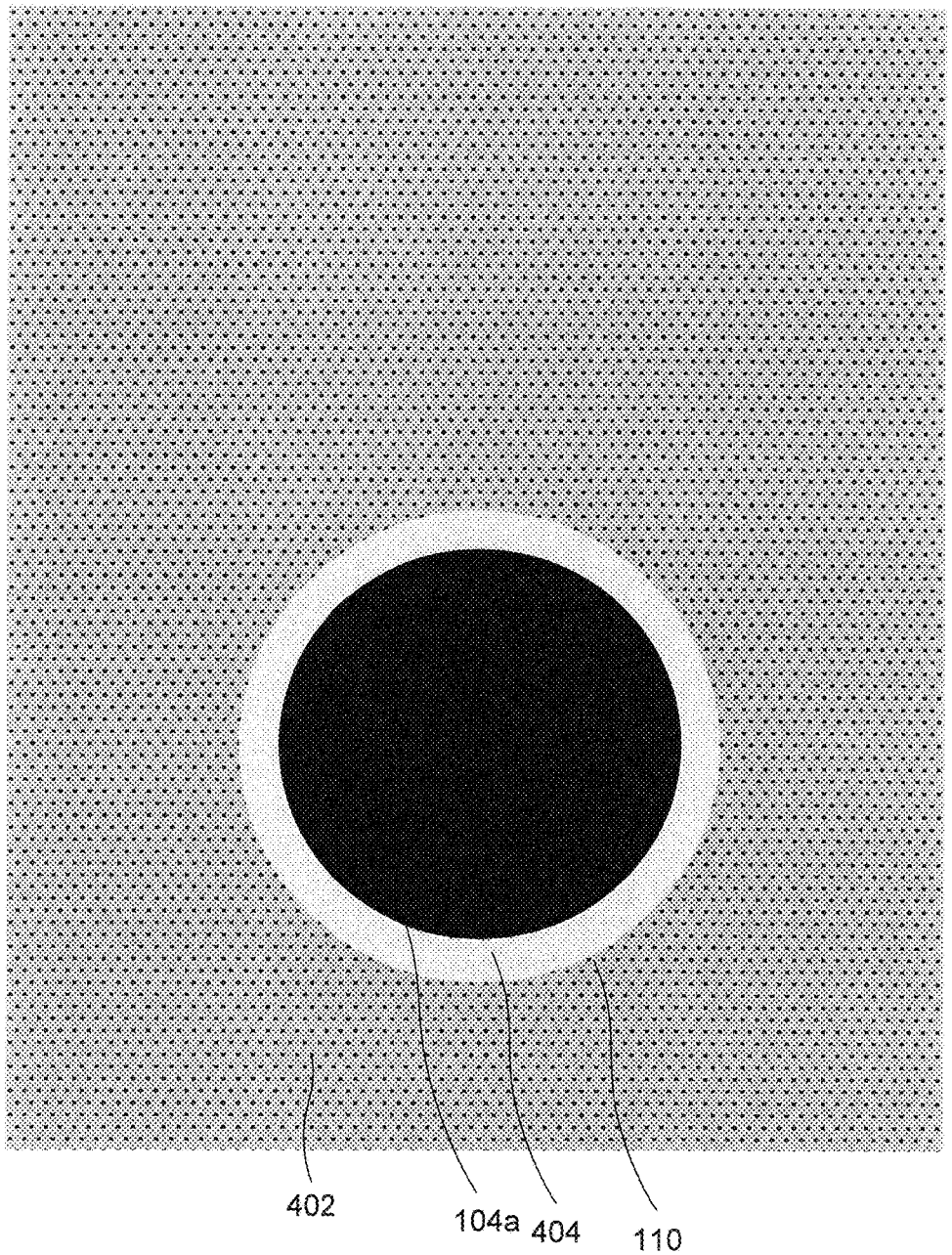
FIG. 12 shows a bottom-up view of the transducer structure depicted in FIGS. 9-11.

In some embodiments, as illustrated in FIG. 12, when viewed from a bottom-up perspective, the visible external features of the sensor structure 100, apart from the encapsulation layer 402, may be the perforation 110, the spacer structure 404, and the membrane structure 104a. Stated another way, the perforation 110 may be formed through a surface of the encapsulation layer 402 which may be considered the bottom side of the sensor structure 100. Further, in various embodiments, and as depicted in FIG. 12, the spacer structure 404 may be located and/or arranged around the perimeter of the perforation 110, and as such, may be visible through the perforation 110 when the sensor structure 100 is viewed from a bottom-up perspective.

Figure 13:
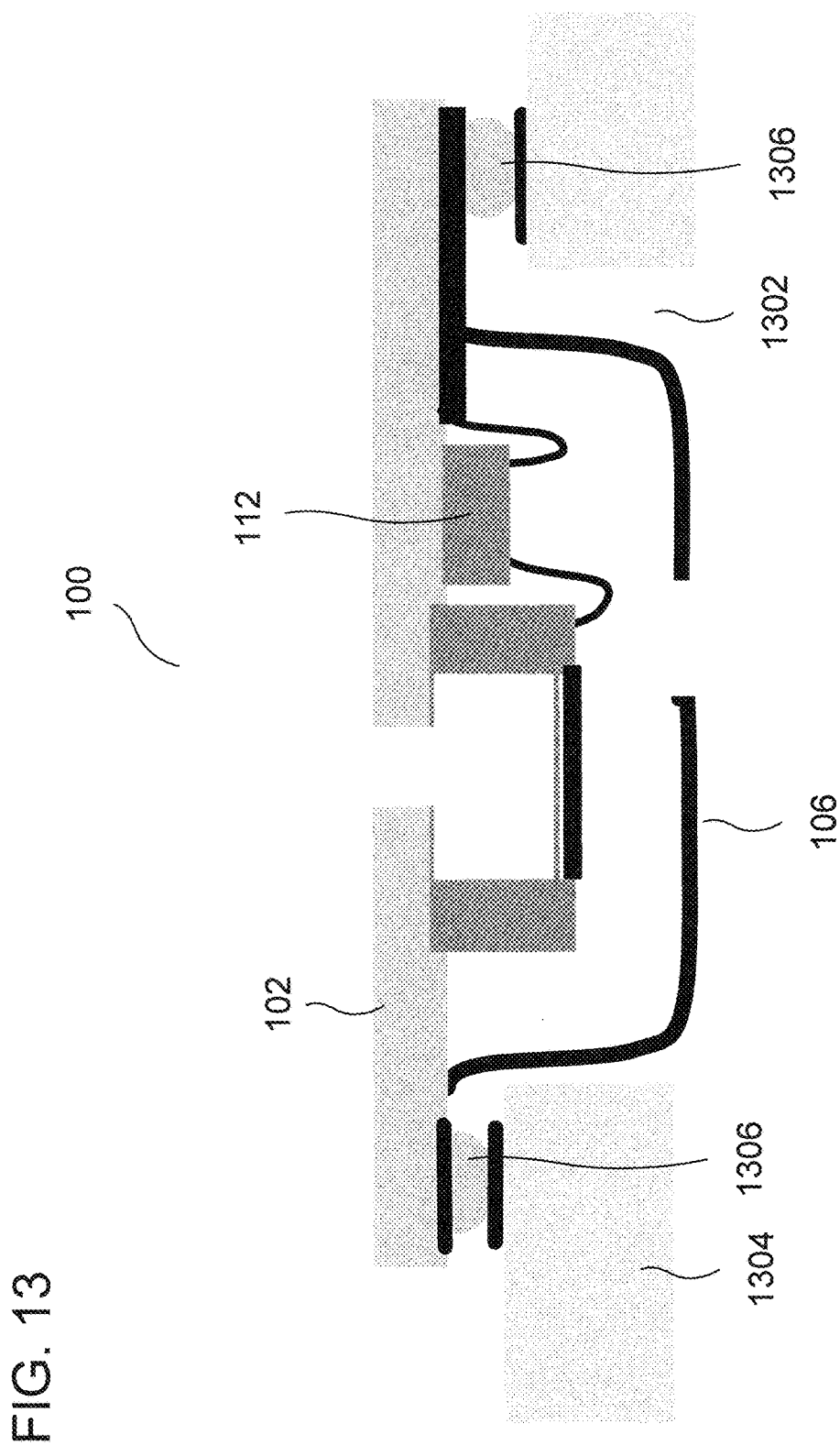
FIG. 13 shows a cross-sectional depiction of a potential embodiment where a transducer structure is mounted in an opening formed through a support structure.

According to various embodiments, as illustrated in FIG. 13, the sensor structure 100 may be mounted and/or fixed in a recess 1302 formed in a support structure 1304. The sensor structure 100 may be fixed to the support structure 1304 so that a substantial portion of the lid 106 is surrounded and/or partially enclosed by the support structure 1304. In some embodiments, the sensor structure may be coupled to the support structure 1304 by a mounting structure 106. The mounting structure 1306 may be implemented as a plurality of mounting structures. In various embodiments, the mounting structure 1306 may be implemented as an electrically conductive fixing medium, e.g. a solder ball, a conductive post, various conductive pastes and epoxies, some of which may have various degrees of elasticity as may be desirable for a given application, etc. In some embodiments, the support structure 1304 may be implemented as various structures as desired for a given application, e.g. a semiconductor substrate, a metal or partially metalized lead frame, a printed circuit board, an electronic device housing structure, such as a cellular telephone casing, etc.

The following examples pertain to further exemplary embodiments.

In Example 1, a transducer structure, which may include a substrate, a MEMS structure disposed over a first side of the substrate, and a lid over the first side of the substrate covering the MEMS structure; the substrate may include an electric contact laterally displaced to the lid on the first side of the substrate, where the electric contact may be electrically coupled to the MEMS structure.

In Example 2, the transducer structure of Example 1 may further include a perforation formed through the substrate and arranged so that at least a portion of the MEMS structure may be suspended across the perforation.

In Example 3, the transducer structure of Example 2, where the perforation may comprise an acoustic communication port configured to conduct acoustic waves to the MEMS structure.

In Example 4, the transducer structure of any one of Examples 1-4 may further include a void formed in the lid.

In Example 5, the transducer structure of Example 4, where the void may be implemented as an acoustic communication port configured to conduct acoustic waves to the MEMS structure.

In Example 6, the transducer structure of any one of Examples 2-5 may further include a back volume lid disposed over a second side of the substrate opposite the first side of the substrate.

In Example 7, the transducer structure of any one of Examples 1-6, where a portion of the substrate may extend laterally beyond the lid.

In Example 8, the transducer structure of any one of Examples 1-7, where the substrate and the lid may be arranged to form a step-like structure.

In Example 9, the transducer structure of any one of Examples 1-8, where the electric contact may be located on a portion of the first side of the substrate not covered by the lid.

In Example 10, the transducer structure of any one of Examples 1-9, where the lid may comprise a metalized material.

In Example 11, the transducer structure of any one of Examples 1-10, where the substrate may comprise a semiconductor substrate.

In Example 12, the transducer structure of any one of Examples 1-11, where the MEMS structure may comprise a MEMS sensor and an ASIC electrically coupled to the MEMS sensor and configured to process at least one signal generated by the MEMS sensor.

In Example 13, a transducer structure, which may include a carrier structure, a MEMS structure disposed over the carrier structure, and a lid defining at least a portion of a back volume of the MEMS structure, where the carrier structure may include an electric contact laterally displaced to the lid on the same side of the carrier structure as the lid and the electric contact is electrically coupled to the MEMS structure.

In Example 14, the transducer structure of Example 13 may further include a perforation formed through the carrier structure and arranged so that at least a portion of the MEMS structure is suspended across the perforation.

In Example 15, the transducer structure of Examples 13 or 14, where the MEMS structure may comprise a MEMS sensor and a ASIC electrically coupled to the MEMS sensor and configured to process at least one signal generated by the MEMS sensor.

In Example 16, the transducer structure of Examples 13 or 14, where a portion of the carrier structure may extend laterally beyond the lid.

In Example 17, the transducer structure of any one of Examples 13-16, where the substrate and the lid may be arranged to form a step-like structure.

In Example 18, the transducer structure of any one of Examples 13-17, where the electric contact may be located on a portion of the first side of the substrate not covered by the lid.

In Example 19, the transducer structure of any one of Examples 13-18, where the lid may comprise a molded lead frame package.

In Example 20, the transducer structure of any one of Examples 13-19, where the carrier structure may comprise a metal carrier.

In Example 21, a transducer structure which may include a carrier structure, a MEMS structure disposed over a first side of the carrier structure, and a back volume lid disposed over a second side of the carrier opposite the first side of the carrier structure; where the carrier structure may include an electric contact laterally displaced to the back volume lid on the second side of the carrier structure, and where the electric contact is electrically coupled to the MEMS structure.

In Example 22, the transducer structure of Example 21 may further include a perforation formed through the carrier structure and arranged so that at least a portion of the MEMS structure is suspended across the perforation.

In Example 23, the transducer structure of Examples 21 or 22, where the perforation may comprise a port configured to allow acoustic communication between the MEMS structure and a back volume enclosed by the back volume lid.

In Example 24, the transducer structure of any one of Examples 21-23, where a portion of the carrier structure may extend laterally beyond the back volume lid.

In Example 25, the transducer structure of any one of Examples 21-24, where the carrier structure and the back volume lid may be arranged to form a step-like structure.

In Example 26, the transducer structure of any one of Examples 21-25, where the electric contact may be located on a portion of the second side of the carrier structure not covered by the back volume lid.

In Example 27, the transducer structure of any one of Examples 21-26, where the back volume lid may be implemented as a molded lead frame package.

In Example 28, the transducer structure of any one of Examples 21-27, where the carrier structure may be implemented as a metal carrier.

In Example 29, the transducer structure of any one of Examples 21-28, where the MEMS structure may be implemented as a MEMS sensor and an ASIC electrically coupled to the MEMS sensor and configured to process at least one signal generated by the MEMS sensor.

In Example 30, a method for forming a transducer structure, the method may include providing a substrate, providing a MEMS structure and arranging the MEMS structure over a first side of the substrate, and arranging a lid over the first side of the substrate to cover the MEMS structure; the substrate may include an electric contact laterally displaced to the lid on the first side of the substrate, where the electric contact is electrically coupled to the MEMS structure.

In Example 31, the method of Example 30 may further include forming a perforation through the substrate and arranging the perforation so that at least a portion of the MEMS structure is suspended across the perforation and configuring the perforation to conduct acoustic waves to the MEMS structure.

In Example 32, the method of Examples 30 or 31 may further include
forming a void in the lid and configuring the void to conduct acoustic waves to the MEMS structure.

In Example 33, the method of any one of Examples 30-32 may further include forming a back volume lid over a second side of the substrate opposite the first side of the substrate.

In Example 34, the method of any one of Examples 30-33, where a portion of the substrate may extend laterally beyond the lid.

In Example 35, the method of any one of Examples 30-34, where the substrate and the lid may be arranged to form a step-like structure.

In Example 36, the method of any one of Examples 30-35, where the electric contact may be located on a portion of the first side of the substrate not covered by the lid.

In Example 37, the method of any one of Examples 30-36, where the lid may be implemented as a metalized material.

In Example 38, the method of any one of Examples 30-37, where the substrate may be implemented as a semiconductor substrate.

In Example 39, the method of any one of Examples 30-38, where the MEMS structure may be implemented as a MEMS sensor and an ASIC electrically coupled to the MEMS sensor and configured to process at least one signal generated by the MEMS sensor.

In Example 40, a method for forming a transducer structure, the method may include providing a carrier structure, providing a MEMS structure disposed over a first side of the carrier structure, and providing a back volume lid disposed over a second side of the carrier opposite the first side of the carrier structure; the carrier structure may be implemented as an electric contact laterally displaced to the back volume lid on the second side of the carrier structure, where the electric contact may be electrically coupled to the MEMS structure.

In Example 41, the method of Example 40 may further include forming a perforation through the carrier structure and arranging the perforation so that at least a portion of the MEMS structure is suspended across the perforation.

In Example 42, the method of Example 41, where the perforation may be implemented as a port configured to allow acoustic communication between the MEMS structure and a back volume enclosed by the back volume lid.

In Example 43, the method of any one of Examples 40-42, where a portion of the carrier structure may extend laterally beyond the back volume lid.

In Example 44, the method of any one of Examples 40-43, where the carrier structure and the back volume lid may be arranged to form a step-like structure.

In Example 45, the method of any one of Examples 40-44, where the electric contact may be located on a portion of the second side of the carrier structure not covered by the back volume lid.

In Example 46, the method of any one of Examples 40-45, where the back volume lid may be implemented a molded lead frame package.

In Example 47, the method of any one of Examples 40-46, where the carrier structure may be implemented as a metal carrier.

In Example 48, the method of any one of Examples 40-47, where the MEMS structure may include a MEMS sensor and a ASIC electrically coupled to the MEMS sensor and configured to process at least one signal generated by the MEMS sensor.

In Example 49, the transducer structure of any one of Examples 1-12, where the lid may be a metal.

In Example 50, the transducer structure of any one of Examples 1-12, where the lid may be a metal foil.

In Example 51, the transducer structure of any one of Examples 1-12, where the substrate may be a metal substrate.

In Example 52, the transducer structure of any one of Examples 1-12, where the substrate may be a glass substrate.

In Example 53, the transducer structure of any one of Examples 1-12, where the substrate may be silicon-on-insulator substrate.

In Example 54, the transducer structure of any one of Examples 1-12, where the MEMS structure may be implemented as a MEMS microphone and an ASIC electrically coupled to the MEMS microphone.

In Example 55, the transducer structure of any one of Examples 1-12, where the MEMS structure may be implemented as a MEMS pressure sensor and an ASIC electrically coupled to the MEMS pressure sensor.

In Example 56, the transducer structure of any one of Examples 1-12, where the MEMS structure may be implemented as a MEMS speaker and an ASIC electrically coupled to the MEMS pressure speaker.

In Example 57, the transducer structure of any one of Examples 1-12, where the electric contact may be configured to be connected to a flexible substrate.

In Example 58, the transducer structure of any one of Examples 13-20, where the carrier structure may be a lead frame.

In Example 59, the transducer structure of any one of Examples 13-20, where the electric contact may be configured to be connected to a flexible substrate.

In Example 60, the transducer structure of any one of Examples 21-29, where the carrier structure may be a lead frame.

In Example 61, the transducer structure of any one of Examples 21-29, where the electric contact may be configured to be connected to a flexible substrate.

What is claimed is:

1. A transducer structure, comprising:
a substrate;
a micro-electro-mechanical system (MEMS) structure disposed over a first side of the substrate;
an integrated circuit disposed over the first side of the substrate;
a lid over the first side of the substrate covering the micro-electro-mechanical system structure and the integrated circuit, wherein a portion of the substrate extends laterally beyond the lid;
a volume defined between the first side of the substrate and the lid so that the MEMS structure and the integrated circuit are located within the volume;
the substrate comprising an electric contact laterally displaced to the lid only on the first side of the substrate, wherein the electric contact is electrically coupled to the micro-electro-mechanical system structure and wherein the electric contact extends along the first side of the substrate from an external environment located outside the volume to inside the volume so that the electric contact physically contacts the lid at a periphery of the volume.

2. The transducer structure of claim 1, further comprising:
a perforation formed through the substrate and arranged so that at least a portion of the micro-electro-mechanical system structure is suspended across the perforation.

3. The transducer structure of claim 2,
wherein the perforation comprises an acoustic communication port configured to conduct acoustic waves to the micro-electro-mechanical system structure.

4. The transducer structure of claim 1, further comprising:
a void formed in the lid.

5. The transducer structure of claim 1,
wherein the substrate and the lid are arranged to form a step-like structure.

6. The transducer structure of claim 1,
wherein the lid comprises a metallic or metalized material, the metallic or metalized material physically contacting at least the electric contact.

7. The transducer structure of claim 1, wherein the integrated circuit is an application specific integrated circuit (ASIC).

8. The transducer structure of claim 1, wherein the integrated circuit is electrically coupled to the MEMS structure.

9. The transducer structure of claim 8, wherein the integrated circuit is electrically coupled to the MEMS structure via a wire bond.

10. The transducer structure of claim 9, wherein the integrated circuit is electrically coupled to the electric contact via a wire bond.

11. The transducer structure of claim 1, wherein the integrated circuit is electrically coupled to the electric contact.

12. The transducer structure of claim 1, wherein the lid comprises at least one or more of copper, nickel, tin, lead, silver, gold, aluminum, cupronickel, and nickel-aluminum.

13. The transducer structure of claim 1, wherein the lid comprises a
micro lead frame package (MLP), a small-outline no-leads package (SON), a quad-flat no-leads package (QFN), or a dual-flat no-leads package (DFN).

14. The transducer structure of claim 1,
wherein the MEMS structure is electrically connected to the substrate.

15. The transducer structure of claim 1,
wherein the MEMS structure is electrically insulated from the substrate.

16. A transducer structure, comprising:
a substrate;
a micro-electro-mechanical system (MEMS) structure disposed over a first side of the substrate; and
an integrated circuit disposed over the first side of the substrate, wherein the integrated circuit is electrically coupled to the MEMS structure and/or is electrically coupled to the electric contact;
a lid over the first side of the substrate covering the micro-electro-mechanical system structure and the integrated circuit, wherein a portion of the substrate extends laterally beyond the lid;
a volume defined between the first side of the substrate and the lid so that the MEMS structure and the integrated circuit are located within the volume;
the substrate comprising an electric contact disposed only on the first side of the substrate, wherein the electric contact is electrically coupled to the micro-electro-mechanical system structure and wherein the electric contact extends along the first side of the substrate from outside the volume to inside the volume so that the electric contact physically and electrically contacts the lid at a periphery of the volume, and wherein the electric contact is disposed only on the first side of substrate.

17. The transducer structure of claim 16, further comprising:
a perforation formed through the substrate and arranged so that at least a portion of the micro-electro-mechanical system structure is suspended across the perforation.

18. The transducer structure of claim 17,
wherein the perforation comprises an acoustic communication port configured to conduct acoustic waves to the micro-electro-mechanical system structure.

19. The transducer structure of claim 16, further comprising:
a void formed in the lid.

* * * * *